(12) United States Patent
Chen

(10) Patent No.: US 7,646,251 B2
(45) Date of Patent: Jan. 12, 2010

(54) RADIO FREQUENCY APPLICATION CIRCUIT

(75) Inventor: Jui-Pin Chen, Taoyuan County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 194 days.

(21) Appl. No.: 12/025,045

(22) Filed: Feb. 3, 2008

(65) Prior Publication Data

US 2008/0186103 A1 Aug. 7, 2008

(30) Foreign Application Priority Data

Feb. 7, 2007 (TW) .............................. 96104483 A

(51) Int. Cl.
*H03F 3/04* (2006.01)
(52) U.S. Cl. ...................................... 330/306; 330/305
(58) Field of Classification Search .................. 330/51, 330/207 P, 298, 305, 306, 307
See application file for complete search history.

(56) References Cited

U.S. PATENT DOCUMENTS 6,194,840 B1 * 2/2001 Chang .................... 315/209 R
6,515,875 B2 * 2/2003 Yasumura ................ 363/21.02
6,687,137 B1 * 2/2004 Yasumura ................ 363/21.01
6,936,977 B2 * 8/2005 Moisin ....................... 315/282

* cited by examiner

*Primary Examiner*—Henry K Choe
(74) *Attorney, Agent, or Firm*—Jianq Chyun IP Office

(57) ABSTRACT

A radio frequency (RF) application circuit is provided. In the RF application circuit, a pair of bipolar junction transistors (BJTs), instead of N-channel metal-oxide-semiconductor (NMOS) transistors, is composed of a switch-block operated in a reversion saturation region. The RF application circuit is used to serve as either an oscillator or a band pass amplifier according to the circuit characteristic of an active circuit. Thereby, not only the function of the conventional NMOS transistor served as a switch can be achieved by the switch-block, but also the element size, turned-on resistance value and turned-off parasitic capacitance value of the switch-block, and the power consumption of the RF application circuit thereof can be reduced. Thus, the resolution of the capacitance unit in a LC resonance circuit and the performance of the RF application circuit thereof can be promoted.

7 Claims, 3 Drawing Sheets

RADIO FREQUENCY APPLICATION CIRCUIT

CROSS-REFERENCE TO RELATED APPLICATION

This application claims the priority benefit of Taiwan application serial no. 96104483, filed on Feb. 7, 2007. The entirety of the above-mentioned patent application is hereby incorporated by reference herein and made a part of this specification.

BACKGROUND OF THE INVENTION

1. Field of the Invention

The present invention relates to a radio frequency (RF) application circuit. More particularly, the present invention relates to a RF application circuit having a switch-block composed of a pair of bipolar junction transistors (BJTs) and applied in a capacitance unit of a LC resonance circuit.

2. Description of Related Art

Conventionally, in the LC (inductance-capacitance) filter or the LC oscillator of a radio frequency (RF) circuit, the switch used in a capacitance bank of a LC resonance circuit is usually implemented with N-channel metal-oxide-semiconductor (NMOS) transistor. This is because the gate side and drain side of the NMOS transistor are separated from each other, thus the DC level of the NMOS transistor is not affected when the NMOS transistor is turned on/off.

However, when the NMOS transistor is served as the switch in the capacitance bank of the LC resonance circuit, the NMOS transistor will be caused the RF circuit consuming a lot of power consumption, this is because the NMOS transistor with a high turned-on resistance value. In order to solve aforementioned problem, conventionally, a plurality of NMOS transistors, which are connected in parallel, can be reduced thereof turned-on resistance value. It is obviously, if the switch in the capacitance bank of the LC resonance circuit are utilized a plurality of NMOS transistors connected in parallel, the element size of the switch is increased, and the turned-off parasitic capacitance value thereof is also increased simultaneously.

In accordance with described above, the increased turned-off parasitic capacitance value of the switch further will be decreased the resolution of the capacitance bank in the LC resonance circuit, and thus the performance of the RF circuit thereof is adversely affected.

SUMMARY OF THE INVENTION

Accordingly, the present invention is directed to a radio frequency (RF) application circuit, wherein a pair of bipolar junction transistors (BJTs), instead of N-channel metal-oxide-semiconductor (NMOS) transistors, is composed of a switch-block, thus not only the functions of the conventional NMOS served as a switch can be achieved by the switch-block, but also the element size, turned-on resistance value, and turned-off parasitic capacitance value of the switch-block, and the power consumption of the RF application circuit thereof can be reduced.

To achieve aforementioned and other objectives, the present invention provides a RF application circuit including a resonance circuit and an active circuit. The resonance circuit includes an inductance unit and a capacitance unit (i.e. a capacitance bank). The total capacitance value of the capacitance unit is determined by the on/off states of N switch-blocks, where N is a positive integer. Each of the switch-blocks includes K, K is a positive integer, pairs of BJTs, wherein the collector and the emitter of each of BJTs in each pair of BJTs are connected to each other in parallel and the base of each of BJTs in each pair of BJTs are connected together, and each pair of BJTs is operated in a reversion saturation region. The function of the RF application circuit is determined by the circuit characteristic of the active circuit.

In a preferred embodiment of the present invention, the RF application circuit further includes a control unit. The control unit outputs a plurality of control signals for respectively turning on/off the switch-blocks. Each of the switch-blocks is turned on when the voltage of the base of each of BJTs in each pair of BJTs is higher than the voltage of the collector and the emitter of each of BJTs in each pair of BJTs; otherwise each of the switch-blocks is turned off.

In a preferred embodiment of the present invention, the RF application circuit is used to serve as an oscillator when the circuit characteristic of the active circuit with a negative resistance characteristic.

In a preferred embodiment of the present invention, the RF application circuit is used to serve as a band pass amplifier when the circuit characteristic of the active circuit with an amplifier characteristic.

According to an embodiment of the present invention, a switch-block composed of at least a pair of BJTs operated in a reversion saturation region is used for replacing the conventionally used NMOS transistor, and the RF application circuit is used to serve as a band pass amplifier or an oscillator according to the circuit characteristic of the active circuit with the negative resistance characteristic or the amplifier characteristic. Thus, not only the function of the conventional NMOS transistor served as a switch can be achieved by the switch-block, but also the element size, turned-on resistance value, turned-off parasitic capacitance value of the switch-block, and the power consumption of the RF application circuit thereof can be reduced. Moreover, the resolution of the capacitance bank in the LC resonance circuit and the performance of the RF application circuit thereof can be promoted.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
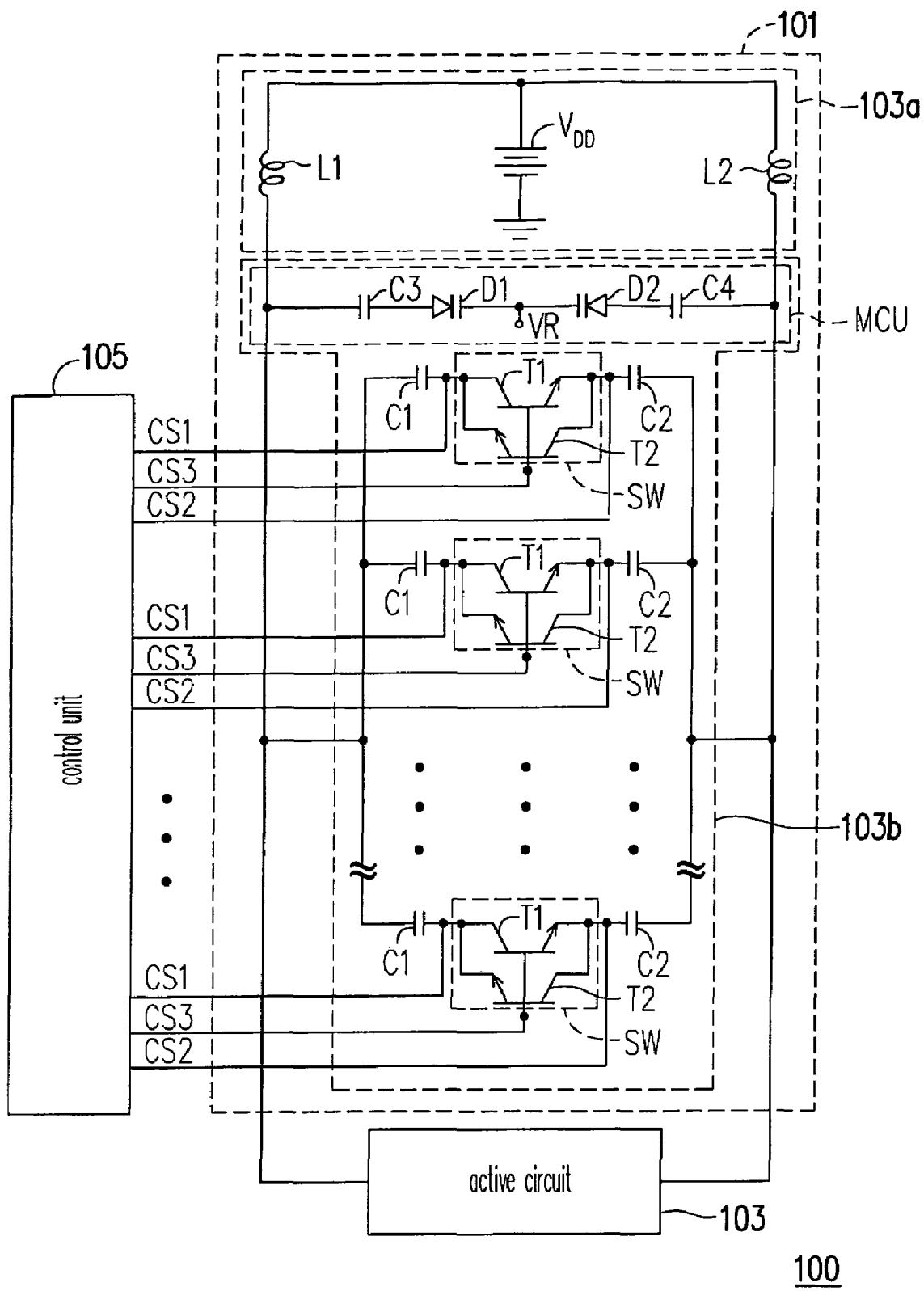
FIG. 1 is a block diagram of a radio frequency (RF) application circuit according to a preferred embodiment of the present invention.

FIG. 1 is a block diagram of a radio frequency (RF) application circuit 100 according to a preferred embodiment of the present invention. Referring to FIG. 1, in the present embodiment, the RF application circuit 100 includes a resonance circuit 101, an active circuit 103 and a control unit 105. The resonance circuit 101 includes an inductance unit 103a and a capacitance unit 103b, and the resonance circuit 101 is a LC resonance circuit.

In the present embodiment, the function of the RF application circuit 100 is determined by the circuit characteristic of the active circuit 103, namely, the RF application circuit 100 is used to serve as a band pass amplifier when the circuit characteristic of the active circuit 103 having an amplifier characteristic; and the RF application circuit 100 is used to serve as an oscillator when the circuit characteristic of the active circuit 103 having a negative resistor characteristic. Accordingly, two inductors L1 and L2 in the inductance unit 103a and two capacitors C1 and C2 in the capacitance unit 103b will produce a corresponding resonant frequency according to the function of the RF application circuit 100.

Generally, the active circuit 103 which can provide the amplifier characteristic and the negative resistance characteristic is well-known to those having ordinary skill in the art therefore will not be described herein.

In the present embodiment, the inductance unit 103a of the resonance circuit 101 is composed of inductors L1 and L2, wherein the inductors L1 and L2 are connected to each other in series and are connected to the capacitance unit 103b in parallel, and a system power $V_{DD}$, provided by a power supply apparatus (for example, a power supplier, not shown), is supplied to the active circuit 103 at a node connected the inductor L1 with the inductor L2. The capacitance unit 103b of the resonance circuit 101 is composed of N (N is a positive integer) capacitor banks, wherein each said capacitor bank includes a capacitor C1, a switch-block SW and a capacitor C2, which are connected in series sequentially, and when the switch-block SW is turned on, the corresponding capacitors C1 and C2 are connected to each other in series; and when the switch-block SW is turned off, the corresponding capacitors C1 and C2 are cut off, so as to the total capacitance value of the capacitance unit 103b is determined.

Generally, the capacitance value variations of the capacitors C1 and C2 in each capacitor bank are designed to be very large, and accordingly, a trimming capacitance unit MCU is usually connected in parallel to the capacitance unit 103b, wherein the trimming capacitance unit MCU includes a plurality of varactor diodes and the capacitance value thereof is determined by a variable voltage VR. In the present embodiment, the trimming capacitance unit MCU includes capacitors C3, C4 and varactor diodes D1 and D2, wherein a variable voltage VR is received at the node connected the varactor D1 with the varactor D2 for trimming the capacitance value of the capacitance unit 103b.

In the present embodiment, the on/off state of the switch-blocks SW are determined by the states of a plurality of control signals CS1, CS2, and CS3 outputted by the control unit 105. Each switch-block SW has a pair of BJTs T1 and T2, wherein the collector and the emitter of each of BJTs T1 and T2 in each pair of BJTs are connected to each other in parallel, and the base of each of BJTs T1 and T2 in each pair of BJTs are connected together, and each switch-block SW is operated in a reversion saturation region. When the voltage of the base of each BJTs T1 and T2 in each pair of BJTs is higher than the voltages of the collector and the emitter of each of BJTs T1 and T2 in each pair of BJTs, the corresponding switch-block SW is turned on; otherwise, the switch-block SW is turned off.

Furthermore, each switch-block SW in the capacitance unit 103b is composed of K (K is a positive integer) pairs of BJTs. In following description, it is assumed that each switch-block SW in the capacitance unit 103b has one pair (i.e. K=1) of BJTs; however, this is only for the convenience of description but not intended for limiting the scope of the present invention. The bases of the transistors T1 and T2 are coupled to each other and are controlled by the control signal CS3 outputted by the control unit 105; the collector of the transistor T1 and the emitter of the transistor T2 are coupled to each other and are controlled by the control signal CS1 outputted by the control unit 105; and the emitter of the transistor T1 and the collector of the transistor T2 are coupled to each other and are controlled by the control signal CS2 outputted by the control unit 105. Thus, when the voltage level of the control signal CS3 is higher than the voltage levels of the control signals CS1 and CS2, the switch-block SW is turned on; otherwise, the switch-block SW is turned off.

As described above, the transistors T1 and T2 are operated in a reversion saturation region because a circulating current is produced when the switch-block SW is turned on, namely, the circulating current flows from the emitters of the transistors T1 and T2 to the collectors thereof, so as to the power consumption of the RF application circuit 100 can be reduced. In the present embodiment, the switch-block SW using two transistors T1 and T2 is adopted, thus, the element size of the switch-block is smaller than the conventional switch using a plurality of NMOS transistors connected in parallel.

Figure 2:
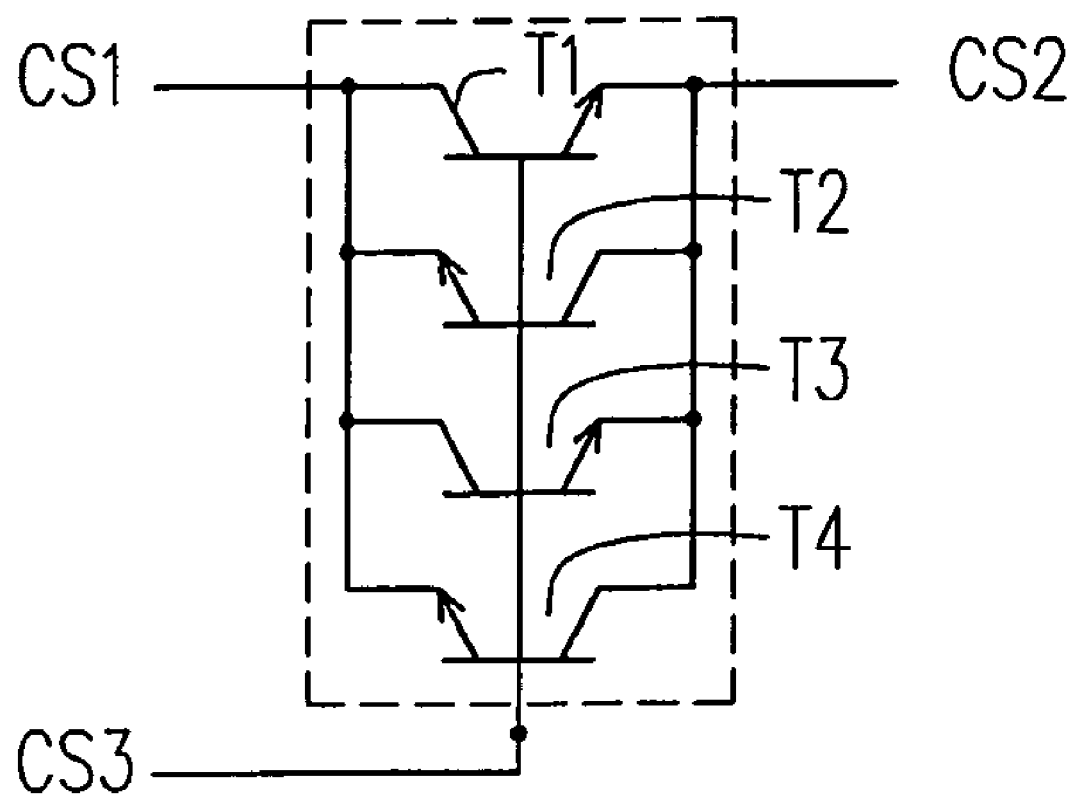
FIG. 2 is a circuit diagram of a switch-block composed of two pair of bipolar junction transistors (BJTs) in a capacitance unit according to another embodiment of the present invention.

FIG. 2 is a circuit diagram of a switch-block composed of two pair of BJTs in a capacitance unit 103b according to another embodiment of the present invention. Referring to FIG. 1 and FIG. 2 together, the bases of the transistors T1, T2, T3 and T4 are coupled together and are controlled by the control signal CS3 outputted by the control unit 105; the collectors of the transistors T1 and T3 and the emitters of the transistors T2 and T4 are coupled together and are controlled by the control signal CS1 outputted by the control unit 105; and the emitters of the transistors T1 and T3 and the collectors of the transistors T2 and T4 are coupled together and are controlled by the control signal CS2 outputted by the control unit 105. The switch-block SW in FIG. 2 is composed of two pairs of BJTs, but the operation function thereof is similar to the switch-block SW having only one pair of BJTs; therefore will not be described herein.

It should be mentioned here that since the switch-block SW in the present embodiment is composed of two pairs of BJTs, the element size and the turned-off parasitic capacitance value of the switch-block and the power consumption of the corresponding RF application circuit thereof are all increased, but thereof turned-on resistance value of the switch-block is reduced. However, a circulating current will also be produced when the switch-block is turned on for it is also operated in a reversion saturation region, thus, the switch-block SW in FIG. 1 or FIG. 2 can be selected according to design requirement; or even more than two pairs of BJTs can be used in each switch-block SW without departing the spirit of the present invention.

Figure 3:
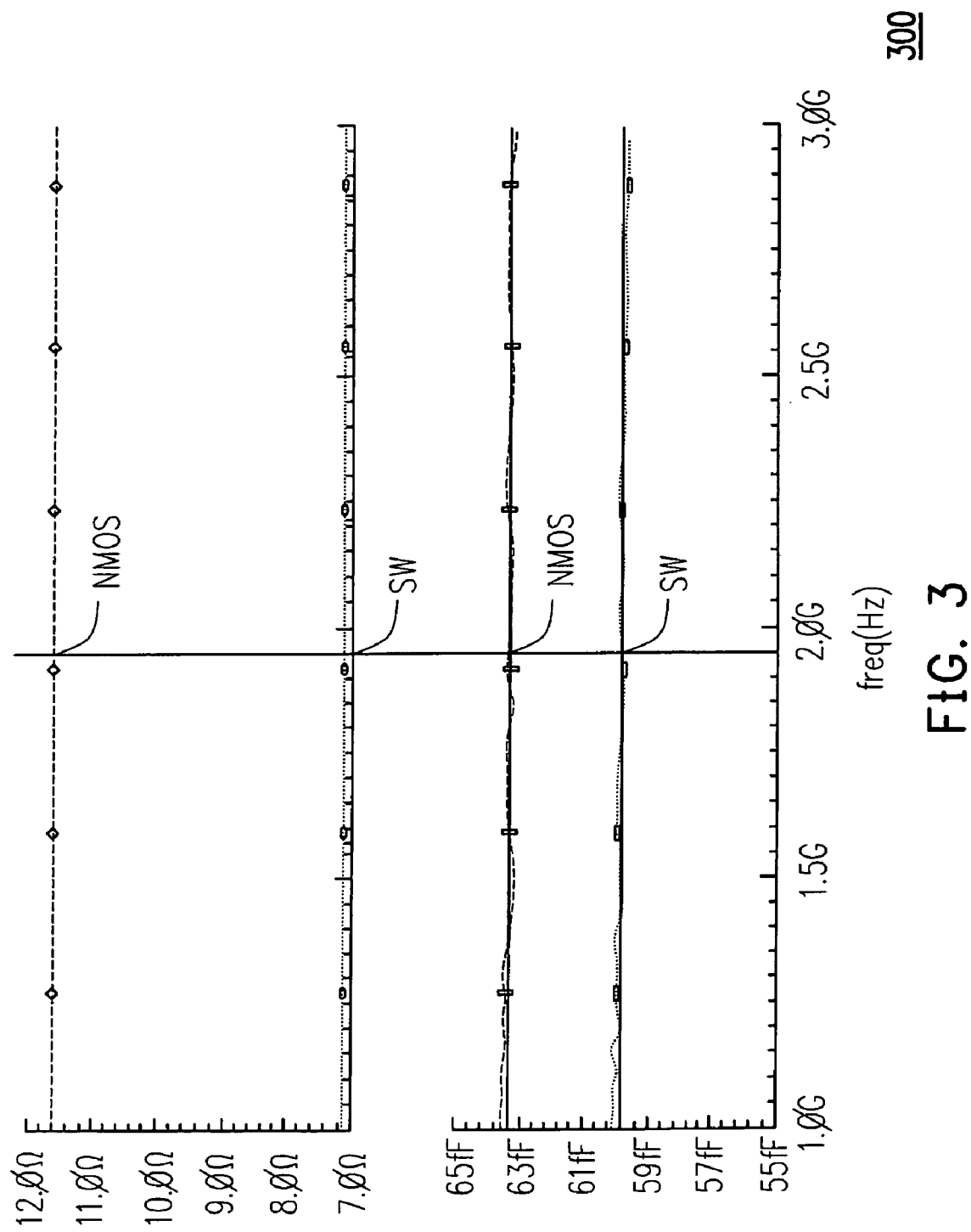
FIG. 3 is a simulation diagram, which is compared with the parasitic capacitance value of a switch-block in the present invention and a conventional NMOS transistor serve as a switch, when the switch-block and the NMOS transistor are situated in the turned-off state.

FIG. 3 is a simulation diagram, which is compared with the parasitic capacitance value of a switch-block SW in the present invention and a conventional NMOS transistor serve as a switch, when the switch-block SW and the NMOS transistor are situated in the turned-off state, wherein the abscissas represented frequencies and the ordinates respectively represented resistance value and capacitance value. Referring to FIG. 3, it is obvious that the turned-on resistances value are respectively 7Ω and 11.6Ω, when the switch-block SW and the conventional NMOS transistor are turned on; and the parasitic capacitances value thereof are respectively 59 fF (i.e. $59\times10^{-15}$ F) and 63 fF (i.e. $63\times10^{-15}$ F), when the switch-block SW in the present invention and the conventional NMOS transistor are turned off. It can be understood from foregoing data that the switch-block SW in the present invention can effectively resolve the problems caused by conventional NMOS transistor served as a switch.

In summary, the present invention provides a RF application circuit, wherein a pair of BJTs, instead of NMOS transistors served as a switch, are used for forming a switch-block and the switch-block is operated in a reversion saturation region. The RF application circuit in the present invention is used to serve as either an oscillator or a band pass amplifier according to the circuit characteristic (i.e. the negative resistance characteristic or the amplifier characteristic) of an active circuit. Therefore, not only the function of the conventional NMOS transistor served as a switch can be achieved by the switch-block in the present invention, but also the element size, turned-on resistance value and turned-off parasitic capacitance value of the switch-block used in a capacitance unit of a LC resonance circuit and the power consumption of the RF application circuit thereof are all reduced. Accordingly, the resolution of the capacitance unit of the LC resonance circuit is increased and the performance of the RF application circuit thereof is also promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A radio frequency (RF) application circuit, comprising:
    a resonance circuit, comprising an inductance unit and a capacitance unit, the capacitance unit is coupled to the inductance unit, a total capacitance value of the capacitance unit is determined by on/off states of N switch-blocks, wherein each of the switch-blocks comprises K pairs of bipolar junction transistors (BJTs), a collector and a emitter of each of BJTs in each pair of BJTs are connected to each other in parallel, a base of each of BJTs in each pair of BJTs are connected together, and each said pair of BJTs is operated in a reversion saturation region, wherein N and K are positive integers; and
    an active circuit, coupled to the resonance circuit, in order to determine a function of the RF application circuit by a circuit characteristic of the active circuit.

2. The RF application circuit as claimed in claim 1, further comprises a control unit for outputting a plurality of control signals to turn on/off the switch-blocks, wherein each of the switch-blocks is turned on when the voltage from the base of the corresponding BJT in each said pair of BJTs is higher than the voltage from the collector and the emitter of the corresponding BJT in each pair of BJTs, otherwise each of the switch-blocks is turned off.

3. The RF application circuit as claimed in claim 2, wherein the capacitance unit further comprises:
    N capacitor banks, each of the capacitor banks composed of a first capacitor, the corresponding switch-block and a second capacitor, which are connected in serial, wherein when the corresponding switch-block is turned on, the first capacitor and the second capacitor are connected to each other in series, otherwise when the corresponding switch-block is turned off, the first capacitor and the second capacitor are cut off, so as to determine the capacitance unit.

4. The RF application circuit as claimed in claim 3, wherein the capacitance unit further comprises:
    a trimming capacitance unit, connected in parallel to the capacitor banks, the trimming capacitance unit comprises a plurality of varactor diodes connected in series, and a capacitance value of the trimming capacitance unit is determined by a variable voltage.

5. The RF application circuit as claimed in claim 1, wherein the inductance unit comprises:
    a first inductor; and
    a second inductor, wherein the first inductor and the second inductor are connected in series, and a system power is supplied to the active circuit at a node connected the first inductor with the second inductor.

6. The RF application circuit as claimed in claim 1, wherein the function of the RF application circuit is used to serve as an oscillator when the circuit characteristic of the active circuit having a negative resistance characteristic.

7. The RF application circuit as claimed in claim 1, wherein the function of the RF application circuit is used to serve as a band pass amplifier when the circuit characteristic of the active circuit having an amplifier characteristic.

* * * * *